(12) United States Patent
Knott

(10) Patent No.: US 8,525,536 B2
(45) Date of Patent: Sep. 3, 2013

(54) LOAD TESTING CIRCUIT

(75) Inventor: Arnold Knott, Michaelsbuch (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 354 days.

(21) Appl. No.: 12/126,178

(22) Filed: May 23, 2008

(65) Prior Publication Data

US 2009/0051368 A1 Feb. 26, 2009

(30) Foreign Application Priority Data

May 23, 2007 (EP) .................................... 07010276

(51) Int. Cl.
*H03K 5/01* (2006.01)
*H04R 29/00* (2006.01)
*H03H 7/38* (2006.01)

(52) U.S. Cl.
USPC ............. 324/713; 327/100; 381/58; 333/124

(58) Field of Classification Search
USPC ............. 324/713–718; 327/100; 381/58–60, 381/96, 111, 116; 333/124, 17.3, 32
See application file for complete search history.

(56) References Cited

U.S. PATENT DOCUMENTS

| | | | | |
|---|---|---|---|---|
| 3,067,297 A | * | 12/1962 | Fink | 381/1 |
| 3,832,572 A | * | 8/1974 | Minamihata et al. | 307/106 |
| 4,550,277 A | * | 10/1985 | Carney | 388/809 |
| 4,683,591 A | * | 7/1987 | Dawson et al. | 381/85 |
| 5,205,619 A | | 4/1993 | Holst et al. | |
| 5,233,496 A | | 8/1993 | Morishige | |
| 5,496,178 A | * | 3/1996 | Back | 434/307 A |
| 5,568,342 A | * | 10/1996 | Tavazzani et al. | 361/18 |
| 5,587,894 A | * | 12/1996 | Naruo | 363/84 |
| 5,719,526 A | | 2/1998 | Fink | |
| 6,184,919 B1 | * | 2/2001 | Asprey et al. | 725/148 |
| 6,707,919 B2 | * | 3/2004 | Koval et al. | 381/100 |
| 2002/0149424 A1 | * | 10/2002 | Honda | 330/207 A |
| 2004/0086140 A1 | * | 5/2004 | Fedigan et al. | 381/96 |
| 2007/0057720 A1 | * | 3/2007 | Hand et al. | 330/10 |

* cited by examiner

*Primary Examiner* — Melissa Koval
*Assistant Examiner* — Farhana Hoque
(74) *Attorney, Agent, or Firm* — O'Shea Getz P.C.

(57) ABSTRACT

A load testing circuit a circuit tests the load impedance of a load connected to an amplifier. The load impedance includes a first terminal and a second terminal, the load testing circuit comprising a signal generator providing a test signal of a defined bandwidth to the first terminal of the load impedance, an energy-storing element being connected to the second terminal of the load impedance and providing an output signal, and a measuring unit that measures the output signal or compares the output signal with a reference.

8 Claims, 4 Drawing Sheets

US 8,525,536 B2

LOAD TESTING CIRCUIT

CLAIM OF PRIORITY

This patent application claims priority to European Patent Application serial number 07 010 276.9 filed on May 23, 2007.

FIELD OF THE INVENTION

The invention relates to a load testing circuit, and in particular to a load testing circuit for detecting the presence of a defined load impedance connected to the output of a power amplifier.

RELATED ART

Many amplifier circuits require overload protection for protecting their output-stages against destruction due to inappropriate loads attached thereto. Suitable loudspeakers (or other electro-acoustic transducers) are a prerequisite for a correct function of the associated amplifiers.

Modern amplifiers are often controlled by microcontrollers that perform many different tasks, such as selecting signal sources, processing user input, and so on. Microcontrollers are also useful for fault-detection. There is a need for a test circuit that allows for easily interfacing with a microcontroller and detects inappropriate electro-acoustic transducers attached to an output-stage of a power amplifier in order to protect the output stage.

SUMMARY OF THE INVENTION

A test circuit for detecting a defined load of an electro-acoustic transducer comprises a signal generator that provides a test signal of a defined bandwidth, an electro-acoustic transducer having a first and a second terminal, the first terminal being connected to the signal generator for receiving the test signal, an energy-storing element being connected to the second terminal of the electro-acoustic transducer, and providing an output signal, and measuring unit that measures the output signal or compares the output signal with a reference.

A method for testing an electro-acoustic transducer comprises providing a test signal of a defined bandwidth, supplying the test signal to a first terminal of an electro-acoustic transducer, thereby providing an output signal at the second terminal of the electro-acoustic transducer, measuring the output signal or for comparing the output signal with a reference.

DESCRIPTION OF THE DRAWINGS

The present invention can be better understood with reference to the following drawings and the description. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
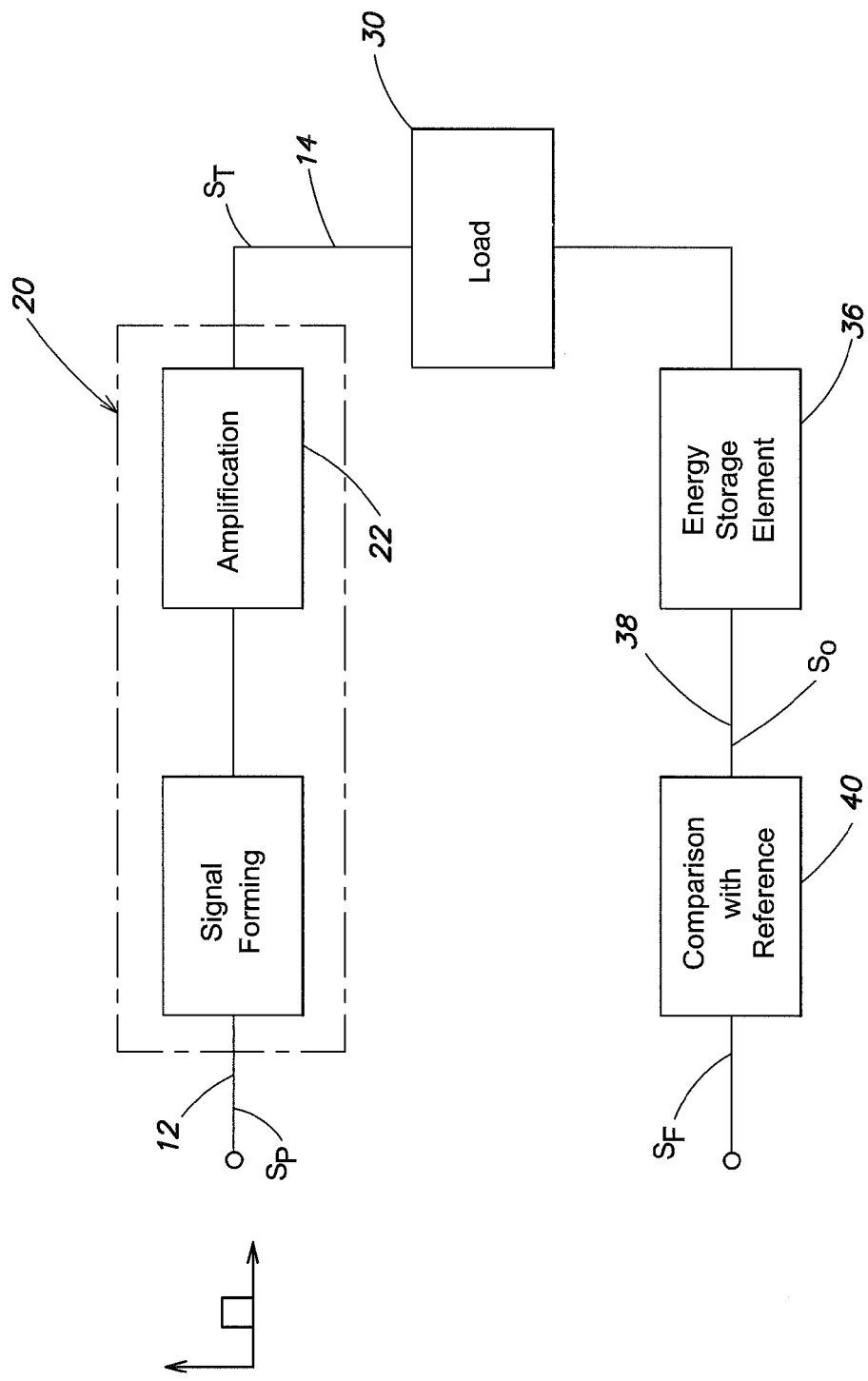
FIG. 1 is a block diagram illustration of a load testing circuit.

Referring to FIG. 1, a pulse signal $S_P$ on a line 12 is provided, for example, by a microcontroller (not shown). The pulse may be generated at an I/O-pin of an I/O-port of the micro-controller. Alternatively, a digital-to-analog converter output of the microcontroller may be used to provide the pulse signal $S_P$ on the line 12. The pulse signal comprises at least one pulse which is, for example, rectangular, and has a spectral bandwidth that may comprise at least parts of the spectral range audible by the human ear.

A test signal $S_T$ on a line 14 is derived from the pulse signal $S_P$ on the line 12 by a signal shaping circuit 20. The test signal ST has a defined bandwidth determined by a transfer function of the signal shaping circuit 20. The bandwidth of the low-pass and/or the band-pass usually depends on the bandwidth of the electro-acoustic transducer (e.g., a loudspeaker) that forms the load 30. As an example, the bandwidth of the band-pass may correspond to the bandwidth of the human ear, which is about 20 kilohertz starting from approximately 20 Hertz. Alternatively, the signal shaping may already be performed by the above-mentioned analog-to-digital converter by converting an arbitrary synthesized signal of the desired bandwidth.

Figure 2:
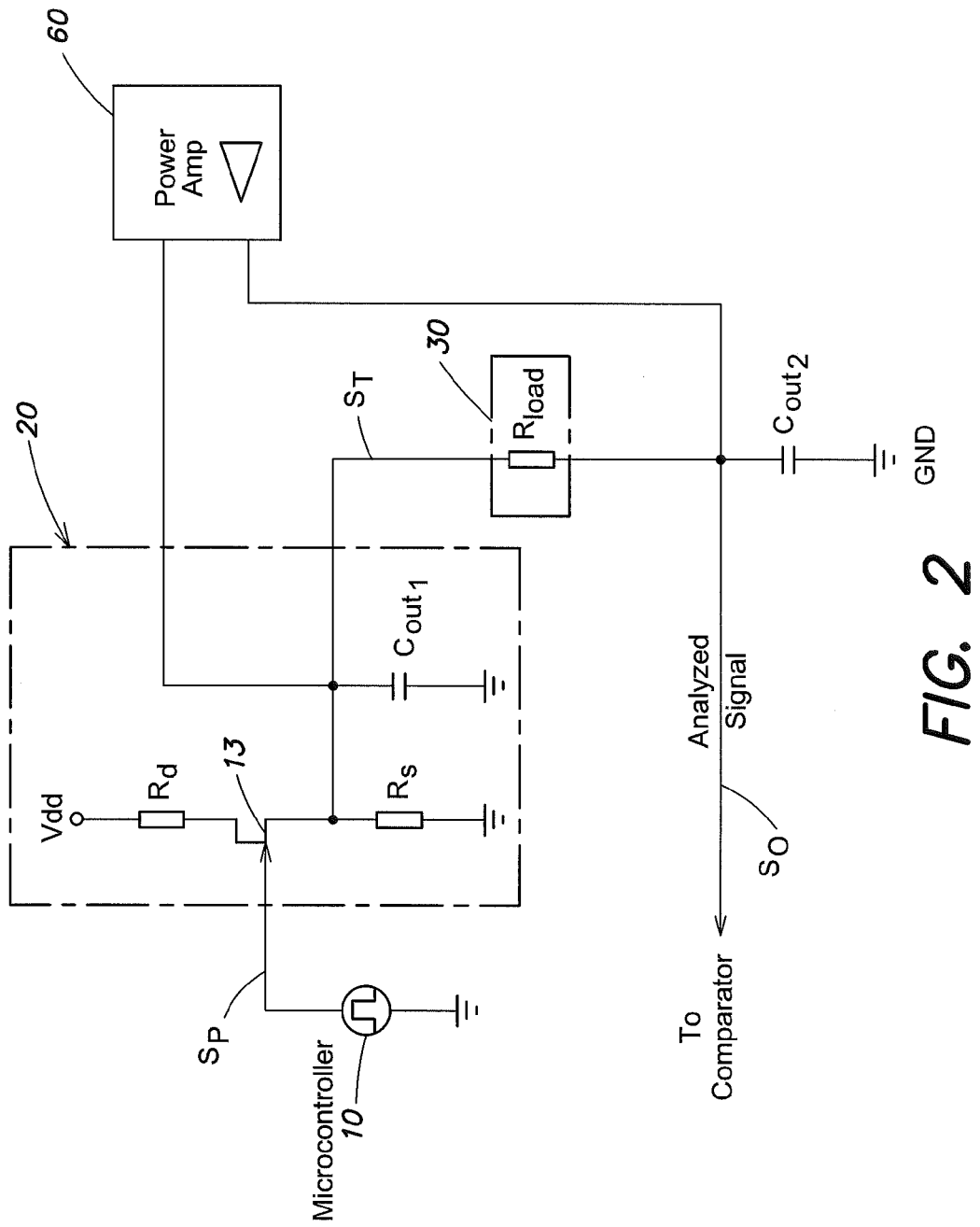
FIG. 2 is a more detailed circuit diagram of the load testing circuit illustrated in FIG. 1.

The signal shaping circuit 20 may also include a amplifier 22 to provide the test signals $S_T$ on the line 14 having higher levels than the original pulse signal $S_P$ or to perform an impedance conversion providing a low-output resistance of the signal shaping circuit 20. The signal shaping circuit 20 is connected to a first terminal of the load 30 (e.g., the electro-acoustic transducer) supplying the test signal $S_T$ to the load 30. A second terminal of the load 30 is connected to an energy storing element 36 which may be, for example, a capacitor $C_{OUT2}$ as illustrated in FIG. 2. Capacitors are usually connected parallel to the output of an amplifier for electromagnetic compatibility (EMC) and electrostatic discharge (ESD) protection. These capacitors can be used as capacitors $C_{OUT1}$ and $C_{OUT2}$ illustrated in FIG. 2.

The energy storing element 36 provides an output signal $S_O$ on a line 38 to a comparator 40. The energy storing element is connected to the load 30, such that the load's impedance and energy storing element form a filter circuit disposed downstream of the signal forming circuit 20. This filter circuit may represent a low-pass as illustrated in FIG. 2 or a band-pass, but the use of other filter characteristics is of course also applicable to the inventive test circuit of the present invention. In each case, the filter characteristics can be interpreted as a representation of the (generally complex) load impedance. In the case of a low-pass filter, the cut-off frequency, and respectively the time constant, of the low-pass depends on the load impedance.

The output signal $S_O$ on the line 38 is supplied to the comparator 40, such as for example a window-comparator or a Schmitt-trigger for comparing the output signal on the line 38 to a threshold. The output signal $S_O$ on the line 38 essentially represents the impulse response (of a band-limited pulse of the test signal $S_T$) of a system formed by the load 30 and the energy storing element 36. Consequently, the load impedance is also represented by the slope of the output signal $S_O$, such that the lower the load impedance, the steeper the slope of the output signal and the earlier a given threshold is reached by the output signal $S_O$ on the line 38. That is, the time period between initiation of the pulse signal $S_P$ (or the test signal $S_T$) and the triggering of the comparator 40 by the output signal So represents the load impedance. This time period can easily be measured by a microcontroller. Alternatively, the output-signal can be directly supplied to an analog-to-digital converter port (A/D-port) of the microcontroller. In this case the functionality of the comparator 40 (or any other, even more complex analysis) can be implemented in the microcontroller.

If the microcontroller detects an inappropriate load impedance 30 it can initiate appropriate measures for protecting the power-amplifier output-stage to which the load-impedance is connected. Thus the above-described circuit can be used for overload protection of a output-stage of a power amplifier. For example, the microcontroller may deactivate the output-stage as long as it senses an unsuitable load impedance 30 (e.g., unsuitable loudspeakers) at the output of the power amplifier.

FIG. 2 illustrates an embodiment of the circuit of FIG. 1. The pulse signal $S_P$ on the line 12 can be generated by microcontroller 10. Therefore, for example, an output pin of the microcontroller can be connected to the signal shaping circuit 20. In the example of FIG. 2 the pulse signal $S_P$ is received by the gate terminal of a junction field-effect transistor 13. It is contemplated that other types of transistors can be used for this purpose as well. The drain terminal of the transistor 13 is connected to a first supply terminal receiving a first supply potential $V_{DD}$ via a resistor $R_d$. The source terminal of the transistor 13 is connected to a second supply terminal receiving a second supply potential (e.g., ground potential GND) via resistor $R_s$. A first capacitor $C_{out1}$ is connected in parallel to the source resistor $R_s$. The test signal $S_T$ is provided by the source terminal of transistor 13, which is also connected to a first terminal of the load impedance (comprising a resistance $R_{load}$). The transistor circuit within the signal shaping circuit 20 essentially forms a source-follower with source resistor $R_s$, a drain resistor $R_d$ and the first capacitor $C_{out1}$. The drain and source resistors $R_d$ and $R_s$, form, together with the first capacitor $C_{out1}$, a first low pass, thus limiting the band width of the pulses in the pulse signal $S_P$ for providing a band limited test signal $S_T$ to the load impedance. This band limitation has to be performed, because some loads, especially electro-acoustic-transducers react in a bad manner or even can be destroyed if too high slopes (occurring for example in rectangular pulses) are applied.

The second terminal of the load 30 is connected to the second supply terminal (ground potential) via an energy storing element such as a second capacitor $C_{out2}$ in the present embodiment. As it can be easily seen from FIG. 2, the load 30 and the second capacitor $C_{out2}$ form a second low pass filter receiving the test signal $S_T$ and providing the output signal $S_O$ on the line 38. This output signal can be supplied to the comparator 40 (not shown in FIG. 2) or directly to an A/D-Port of a microcontroller as explained above reference to FIG. 1. The output stage of a power amplifier 60 is connected to the first and the second terminal of the load 30. The circuit of FIG. 2 can be used also for overload protection of the output stage. The microcontroller can therefore keep the output stage deactivated until the correct load impedance, i.e., an appropriate electro-acoustic transducer is detected.

Figure 3:
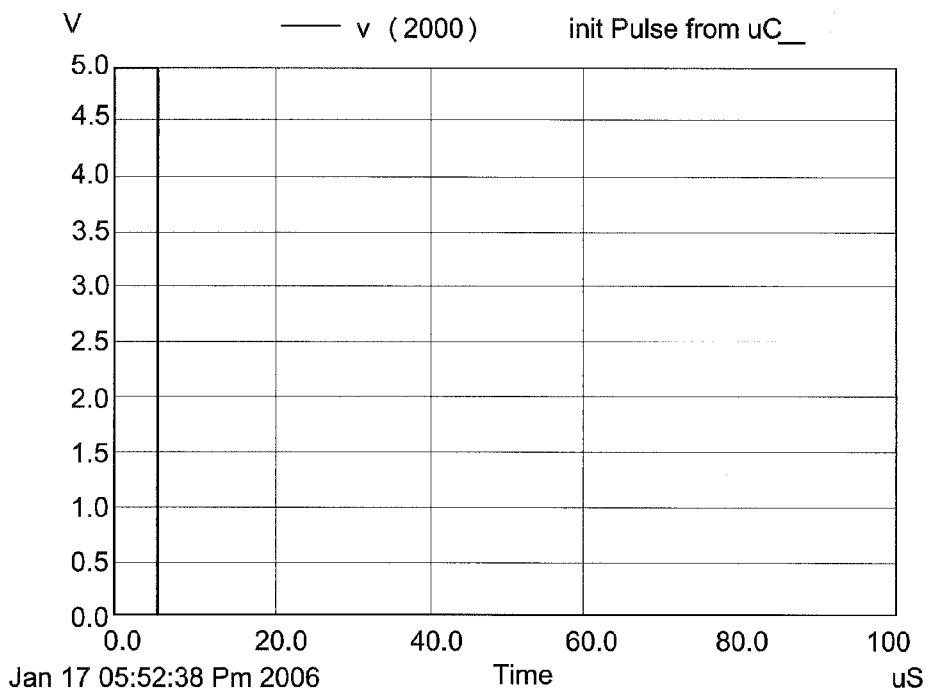
FIG. 3 is a timing diagram illustrating a test signal before low-pass filtering.
Figure 4:
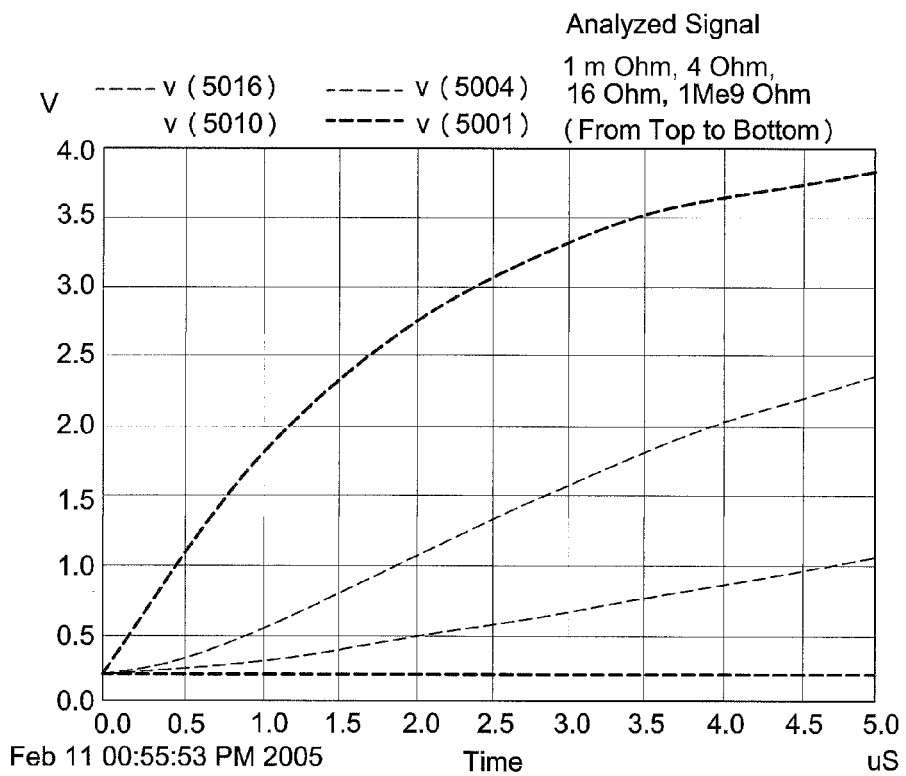
FIG. 4 is a timing diagram illustrating different output signals corresponding to different impedance values of the load.

FIGS. 3 and 4 illustrate some exemplary experimental data. FIG. 3 is a timing diagram showing an exemplary pulse signal $S_P$ having a pulse width of 5 ms. FIG. 4 shows output signals $S_O$ for different load impedances (e.g., 1 mΩ, 4Ω, 16Ω, 1 MΩ). If the output signal $S_O$ is supplied to a comparator, an appropriate threshold value may be, for example, 2 volts. Assuming further, the threshold level is reached within about 4 μs, then it can be concluded the load impedance is about 4Ω. If the threshold level is reached in a shorter time, the impedance is too low, whereas, if the threshold value is reached later, the impedance is too high.

Figure 5:
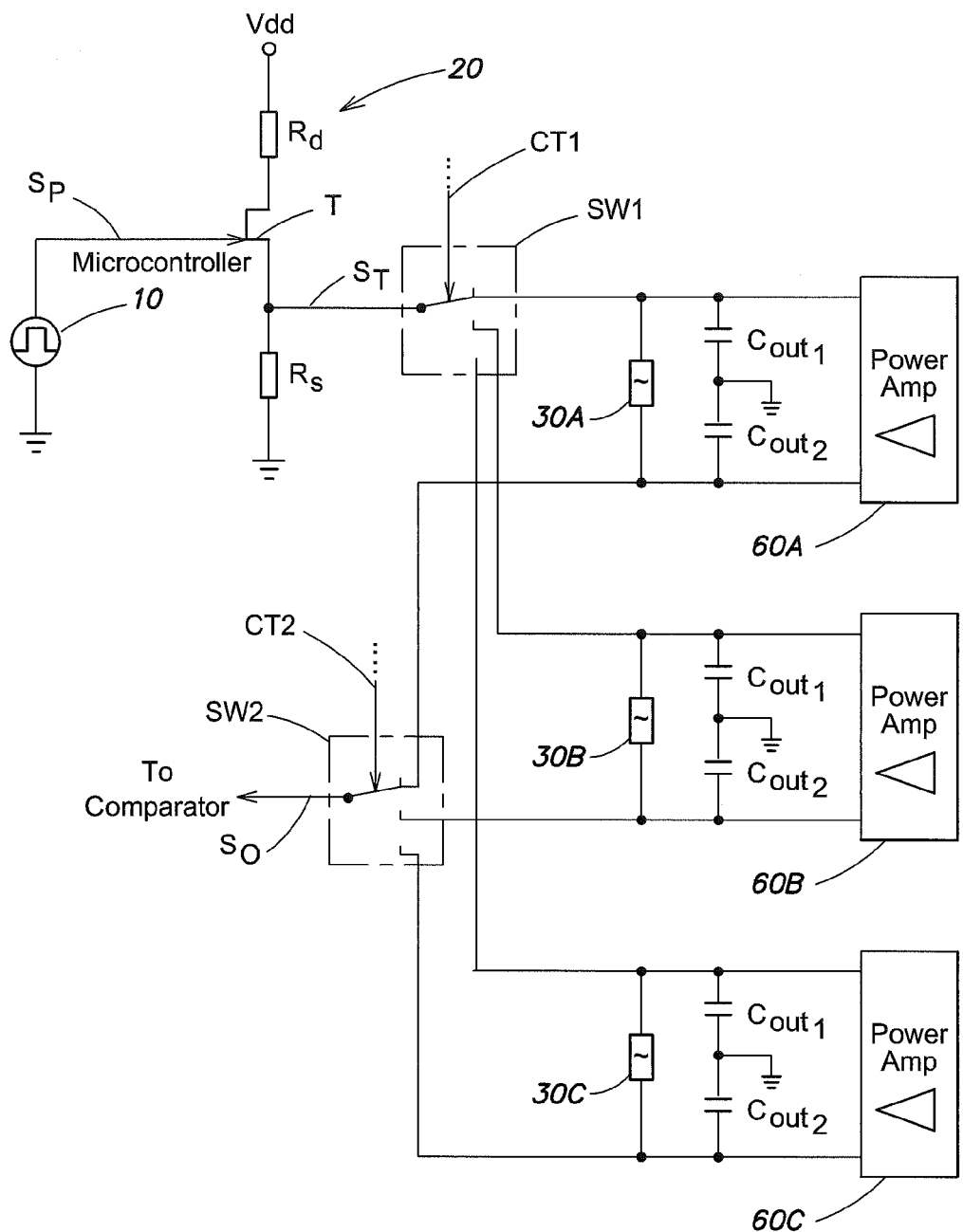
FIG. 5 is a circuit diagram of another example of the load testing circuit.

FIG. 5 illustrates another embodiment of a load testing circuit. By employing multiplex-switches SW1 and SW2 the signal shaping circuit 20 can be used for different amplifiers. In the shown example each of the three power amplifier 60A, 60B, 60C has an associated load 30A, 30B, 30C, respectively, connected to its output terminals. A first capacitor $C_{OUT1}$ and a second capacitor $C_{OUT2}$ are connected between the first output terminal of the amplifier and the reference potential (e.g., ground potential GND) and a second output terminal of the amplifier and the reference potential, respectively. As mentioned above the capacitors $C_{OUT1}$ and $C_{OUT2}$ may be part of the amplifier output stage.

The first output terminals of each of the amplifiers 60A, 60B, and 60C and the signal shaping circuit 20 are connected to the multiplex-switch SW1 such that either the first amplifier 60A, the second amplifier 60B, or the third amplifier 60C is connected to the signal shaping circuit 20. The second output terminals of each of the amplifiers 60A, 60B, and 60C and the signal shaping circuit 20 are connected to the multiplex-switch SW2 such that either the first amplifier 60A, the second amplifier 60B, or the third amplifier 60C is connected to the comparator (not shown). Of course the multiplex-switches SW1 and SW2 have to switch synchronous, i.e., if the first output terminal of the second amplifier 60B is connected to the signal shaping circuit 20, then the second output terminal of second amplifier 60B has to be connected to the comparator.

The multiplex-switches SW1 and SW2 may be controlled by control signals CT1 and CT2 generated by the microcontroller 10. In each switching state of the multiplex-switches SW1 and SW2 a circuit as depicted in FIG. 2 is effectively achieved, where the connected amplifier can be switched. One of ordinary skill will immediately recognize that variations and modifications of the circuit explained with respect to the example of FIG. 2 are also applicable to the exemplary circuit of FIG. 5. The number of connectable amplifiers is of course not limited to three.

It is to be understood, that the invention is not limited to detection of the load impedances of electro-acoustic transducers connected to the output stage of an amplifier, but may be employed to detect any load impedance connected to an arbitrary power supply. Dependent on the application, the capacitors $C_{OUT1}$ and $C_{OUT2}$ may be replaced by inductors.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:
1. A loudspeaker load testing circuit for detecting the impedance of a loudspeaker, the loudspeaker load testing circuit comprising:
 a loudspeaker having a first terminal and a second terminal;
 a test signal generator that is connected to the first terminal of the loudspeaker to provide a test signal of a defined bandwidth to the first terminal of the loudspeaker;

an energy-storing element having a first element lead connected to the second terminal of the loudspeaker and a second element lead connected to a reference voltage; and a measuring unit that compares an output signal value at the second terminal of the loudspeaker to determine if the output signal value exceeds a threshold value, where the test signal generator comprises a microcontroller, and an amplifier that provides the drive signal, where the test signal generator further comprises a signal shaping circuit connected to an output pin of the microcontroller for providing the test signal.

2. The test circuit of claim 1, where the signal shaping circuit comprises a low-pass filter for determining the bandwidth of the test signal.

3. The test circuit of claim 1, where the signal shaping circuit comprises:
- a semiconductor switch with a control terminal, a first and a second load terminal, the control terminal being connected to an output of the microcontroller;
- a first resistor connecting a first supply terminal and the first load terminal of the semiconductor switch;
- a second resistor connecting the second load terminal of the semiconductor switch and a second supply terminal; and
- a capacitor connected in parallel to the second resistor.

4. A loudspeaker load testing circuit for detecting the impedance of a loudspeaker, the loudspeaker load testing circuit comprising:
- a loudspeaker having a first terminal and a second terminal;
- a test signal generator that is connected to the first terminal of the loudspeaker to provide a test signal of a defined bandwidth to the first terminal of the loudspeaker;
- an energy-storing element having a first element lead connected to the second terminal of the loudspeaker and a second element lead connected to a reference voltage; and
- a measuring unit that compares an output signal value at the second terminal of the loudspeaker to determine if the output signal value exceeds a threshold value, where the measurement unit comprises a threshold detector,
- where the threshold detector comprises a Schmitt-Trigger.

5. A loudspeaker load testing circuit for detecting the impedance of a loudspeaker, the loudspeaker load testing circuit comprising:
- a loudspeaker having a first terminal and a second terminal;
- a test signal generator that is connected to the first terminal of the loudspeaker to provide a test signal of a defined bandwidth to the first terminal of the loudspeaker;
- an energy-storing element having a first element lead connected to the second terminal of the loudspeaker and a second element lead connected to a reference voltage; and
- a measuring unit that compares an output signal value at the second terminal of the loudspeaker to determine if the output signal value exceeds a threshold value, where the measurement unit comprises a threshold detector,
- where the threshold detector comprises a window-comparator.

6. A loudspeaker load testing circuit for detecting the impedance of a loudspeaker, the loudspeaker load testing circuit comprising:
- a loudspeaker having a first terminal and a second terminal;
- a test signal generator that is connected to the first terminal of the loudspeaker to provide a test signal of a defined bandwidth to the first terminal of the loudspeaker;
- an energy-storing element having a first element lead connected to the second terminal of the loudspeaker and a second element lead connected to a reference voltage; and
- a measuring unit that compares an output signal value at the second terminal of the loudspeaker to determine if the output signal value exceeds a threshold value,
- where the test circuit is switchable to different load impedances of different amplifiers by multiplex-switches.

7. The test circuit of claim 6, where the energy-storing element comprises an inductive element.

8. The test circuit of claim 6, where the energy-storing element comprises a capacitive element.

* * * * *